United States Patent
Tung et al.

(10) Patent No.: US 9,589,800 B2
(45) Date of Patent: *Mar. 7, 2017

(54) METHOD FOR INTEGRATED CIRCUIT PATTERNING

(71) Applicant: Taiwan Semiconductor Manufacturing Company, Ltd., Hsin-Chu (TW)

(72) Inventors: Szu-Ping Tung, Taipei (TW); Ching-Hua Hsieh, Hsinchu (TW); Huang-Yi Huang, Hsin-Chu (TW); Neng-Jye Yang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/846,112

(22) Filed: Sep. 4, 2015

(65) Prior Publication Data

US 2016/0071730 A1 Mar. 10, 2016

Related U.S. Application Data

(63) Continuation of application No. 14/088,569, filed on Nov. 25, 2013, now Pat. No. 9,129,814.

(51) Int. Cl.

| | |
|---|---|
| *H01L 21/311* | (2006.01) |
| *H01L 21/302* | (2006.01) |
| *H01L 21/033* | (2006.01) |
| *C23G 1/02* | (2006.01) |
| *H01L 21/308* | (2006.01) |
| *H01L 21/3213* | (2006.01) |

(52) U.S. Cl.
CPC ............ *H01L 21/0338* (2013.01); *C23G 1/02* (2013.01); *H01L 21/0337* (2013.01); *H01L 21/3086* (2013.01); *H01L 21/31144* (2013.01); *H01L 21/31111* (2013.01); *H01L 21/32134* (2013.01)

(58) Field of Classification Search
None
See application file for complete search history.

(56) References Cited

U.S. PATENT DOCUMENTS

| | | | |
|---|---|---|---|
| 5,328,810 | A | 7/1994 | Lowrey et al. |
| 5,489,548 | A | 2/1996 | Nishioka et al. |
| 6,472,283 | B1 | 10/2002 | Ishida et al. |
| 7,179,245 | B2 | 2/2007 | Giori |
| 7,250,114 | B2 | 7/2007 | Kiehlbauch et al. |
| 7,670,914 | B2 | 3/2010 | Krivokapic |
| 7,776,744 | B2 | 8/2010 | Sandhu et al. |
| 8,043,921 | B2 | 10/2011 | Kirkpatrick et al. |

(Continued)

OTHER PUBLICATIONS

Felicia Goh et al., "Challenges in Sub-Micron Contact Hole Cleaning," ECS Transactions, 11 (2), pp. 267-274 (2007), The Electrochemical Society.

(Continued)

*Primary Examiner* — Shamim Ahmed
(74) *Attorney, Agent, or Firm* — Haynes and Boone, LLP

(57) ABSTRACT

A method of forming a target pattern includes forming a plurality of lines over a substrate and forming spacer features on sidewalls of the lines. The method further includes shrinking the spacer features using a wet process. After the shrinking of the spacer features, the method further includes removing the lines thereby providing the shrunk spacer features over the substrate.

20 Claims, 8 Drawing Sheets

(56) References Cited

U.S. PATENT DOCUMENTS 8,906,757 B2    12/2014  Kim et al.
2010/0130010 A1    5/2010  Park et al.

OTHER PUBLICATIONS

Xiaomin Yang et al., "Electron-Beam Lithography Method for Sub-50-nm Isolated Trench with High Aspect Ratio," The Smithsonian/NASA Astrophysics Data System, Emerging Lithographic Technologies VII, Edited by Engelstad, Roxann L. Proceedings of the SPIE, vol. 5037, pp. 168-177 (11 pages), 2003.

METHOD FOR INTEGRATED CIRCUIT PATTERNING

This is a continuation application of U.S. patent application Ser. No. 14/088,569 entitled "METHOD FOR INTEGRATED CIRCUIT PATTERNING," filed Nov. 25, 2013, now issued U.S. Pat. No. 9,129,814, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
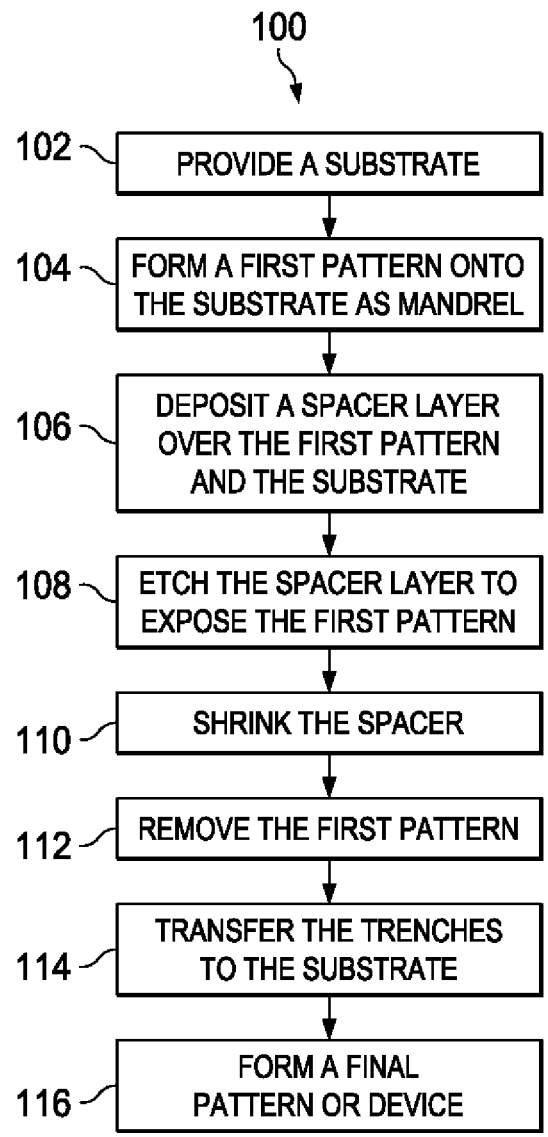
FIG. 1 is a flow chart of a method of forming a target pattern or device on a substrate for implementing one or more embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is generally related to using spacer techniques to improve integrated circuit pattern density in advanced process nodes, such as 14 nanometer (nm), 10 nm, and so on, with 193 nm immersion lithography or other suitable lithographic technologies.

Referring now to FIG. 1, a flow chart of a method 100 for forming a target pattern or device according to various aspects of the present disclosure is illustrated. Additional operations can be provided before, during, and after the method 100, and some operations described can be replaced, eliminated, or moved around for additional embodiments of the method. The method 100 will be further described below. The method 100 is an example, and is not intended to limit the present disclosure beyond what is explicitly recited in the claims.

Figure 2:
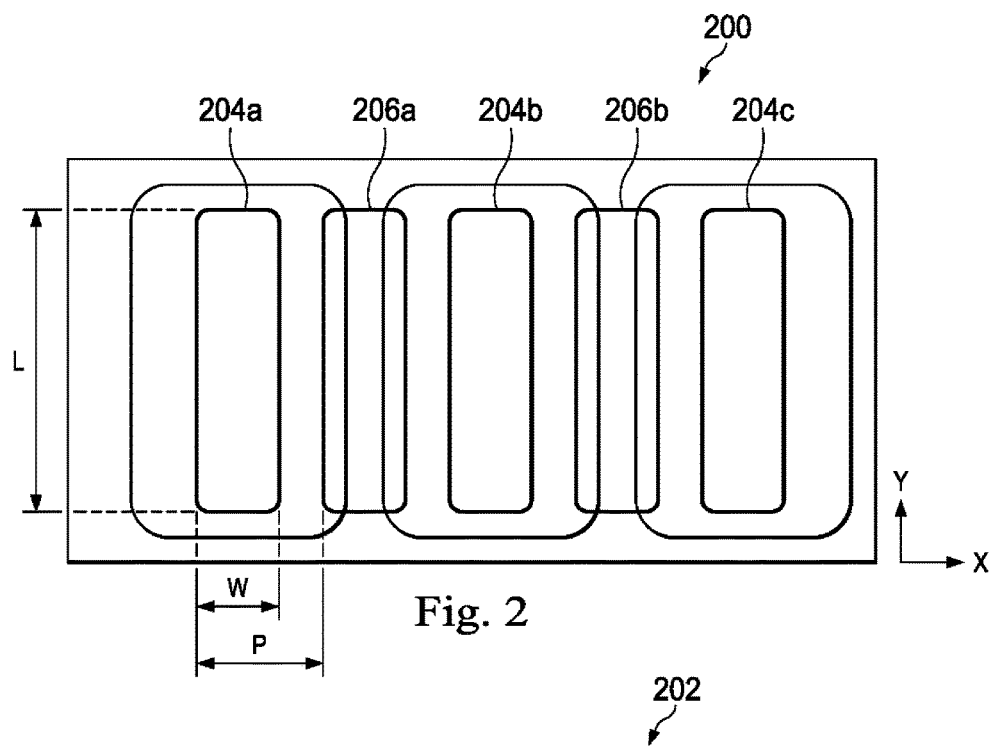
FIG. 2 illustrates an exemplary substrate and a target pattern to be formed thereon according to various aspects of the present disclosure.

FIG. 2 shows an exemplary target pattern 200. The target pattern 200 includes features 204a-c and 206a-b. For the sake of example, the features 204a-c and 206a-b are substantially rectangular trenches with the same dimensions, W in X direction and L in Y direction. They are arranged in a row with a pitch P. The target pattern 200 may be used to form various features of an integrated circuit (IC). In an embodiment, the target pattern 200 is used to form metal lines in a multilayer interconnection structure. In another embodiment, the target pattern 200 is used to form a plurality of trenches in the semiconductor substrate for shallow trench isolation (STI) features. As the density of integrated circuits increases, some features may be too close together for the resolution of a mask (or photo-mask). To overcome this issue, a spacer self-align patterning technique may be used. In the present embodiment, the features 204a-c are to be formed with a mask (or photo mask), while the features 206a-b are to be formed with spacer features.

In the following discussion, the method 100 (FIG. 1) is described in conjunction with FIGS. 3a-9b to show how the target pattern 200 is formed using the mask and the spacer features according to various aspects of the present disclosure. In each of the FIGS. 3a-9b, the figure designated with the suffix "a" (e.g., FIG. 3a) includes a dotted line that defines cross sectional views for the figures designated with the suffix "b," "c," and so on (e.g., FIG. 3b).

Figure 3A:
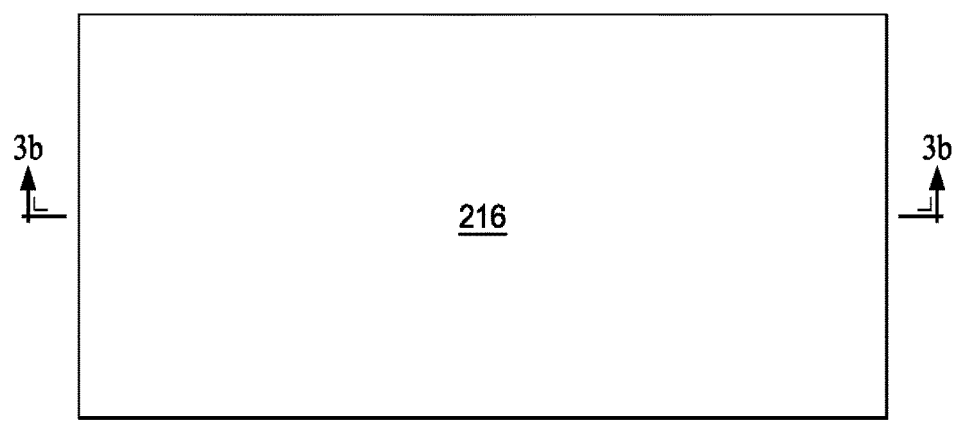
FIGS. 3a, 3b, 4a, 4b, 5a, 5b, 6a, 6b, 7a, 7b, 8a, 8b, 9a, and 9b are top and cross sectional views of forming the target pattern of FIG. 2 according to the method of FIG. 1, in accordance with an embodiment.
Figure 3B:
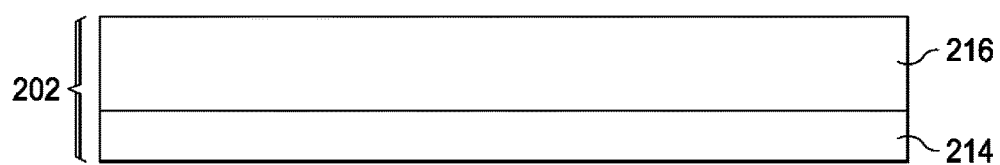

The method 100 (FIG. 1) begins at operation 102 by providing a substrate 202. Referring to FIGS. 3a and 3b, in the present embodiment, the substrate 202 includes material layers 214 and 216. The material layers 214 and 216 may use amorphous silicon (a-Si), silicon oxide, silicon nitride (SiN), nitrogen-free anti-reflection coating (NFARC), spin-on glass (SOG), titanium nitride, or other suitable material or composition. The material layers 214 and 216 may be formed by a variety of processes. For example, the material layer 214 may be formed over another substrate by a procedure such as deposition. In an embodiment, the material layer 216 may include silicon oxide formed by thermal oxidation. In an embodiment, the material layer 216 may include SiN formed by chemical vapor deposition (CVD). For example, the material layer 216 may be formed by CVD using chemicals including Hexachlorodisilane (HCD or $Si_2Cl_6$), Dichlorosilane (DCS or $SiH_2Cl_2$), Bis(TertiaryButylAmino) Silane (BTBAS or $C_8H_{22}N_2Si$) and Disilane (DS or $Si_2H_6$). The material layers 214 and 216 may be formed by a similar or a different procedure. The exemplary compositions of the material layers 214 and 216 aforementioned do not limit the inventive scope of the present disclosure.

Figure 4A:
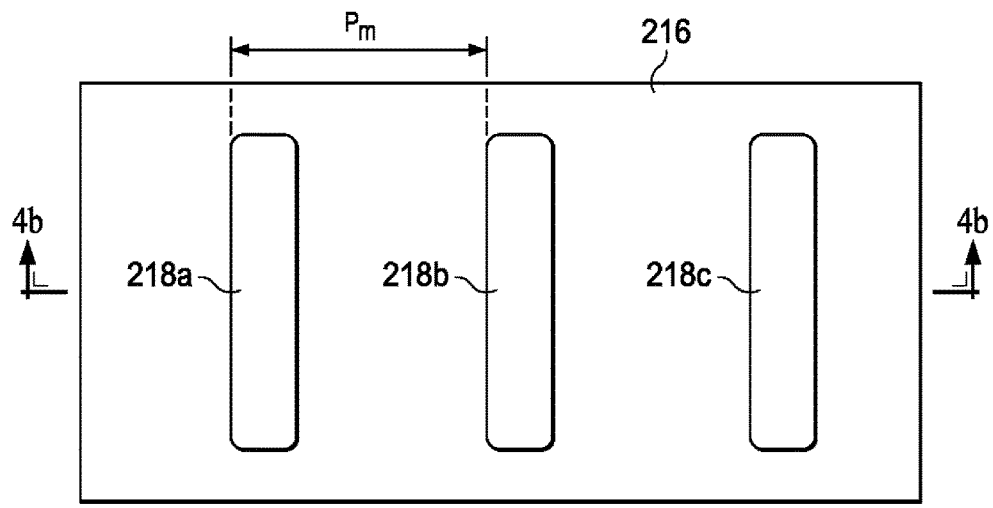
Figure 4B:
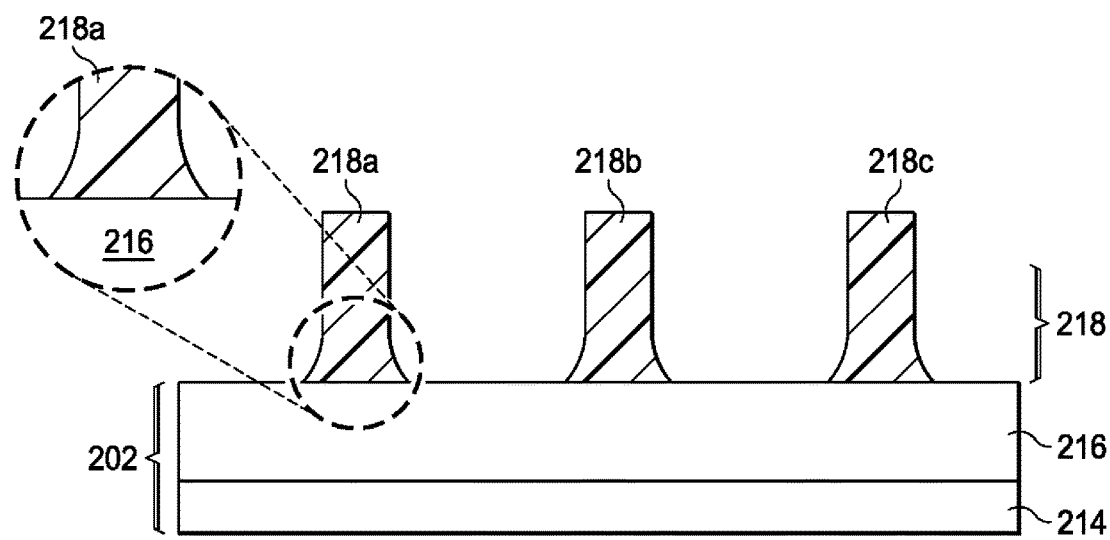

The method 100 (FIG. 1) proceeds to operation 104 by forming mandrel lines over the substrate 202 with the mask through a suitable process, such as a process including a photolithography process. Referring to FIGS. 4a and 4b, mandrel lines 218a-c are formed over the substrate 202. The mandrel lines 218a-c are defined in the mask corresponding to the features 204a-c (FIG. 2) respectively with a pitch $P_m$.

In an embodiment, the mandrel lines 218a-c are formed in a negative or positive resist (or photoresist) material in a photolithography process. An exemplary photolithography process includes coating a negative resist layer 218 over the material layer 216, soft baking the resist layer 218, and exposing the resist layer 218 to a deep ultraviolet (DUV) light using the mask. The process further includes post-exposure baking (PEB), developing, and hard baking thereby removing unexposed portions of the resist layer 218 and leaving exposed portions of resist layer 218 on the substrate 202 as the mandrel lines 218a-c. In another embodiment, the mandrel lines 218a-c may be formed with unexposed portions of a positive resist material layer in a similar photolithography process.

In some cases, the features in the mask may be larger than the corresponding features of the target pattern 200 (FIG. 2). In such cases, the operation 104 may further include a trimming process to trim the dimensions of features 218a-c in both X and Y directions.

When the features 218a-c are formed in a photolithography process, a footing issue may occur. As illustrated in FIG. 4b, at the bottom of the mandrel line 218a, the resist material 218 forms a blunt angle, rather than a right angle, with the material layer 216. One reason for the footing issue may be that the resist material 218 may adhere to the material layer 216 and thus becomes difficult to remove. Another reason may be that the pitch $P_m$ is very small while the mandrel lines 218a-c are relatively tall such that it is difficult for the resist developing solutions to reach the bottom of the mandrel lines 218a-c. This issue may become more acute when the integrated circuit pattern density continues to increase in advanced process nodes, such as 14 nm, 10 nm, and beyond.

Figure 5A:
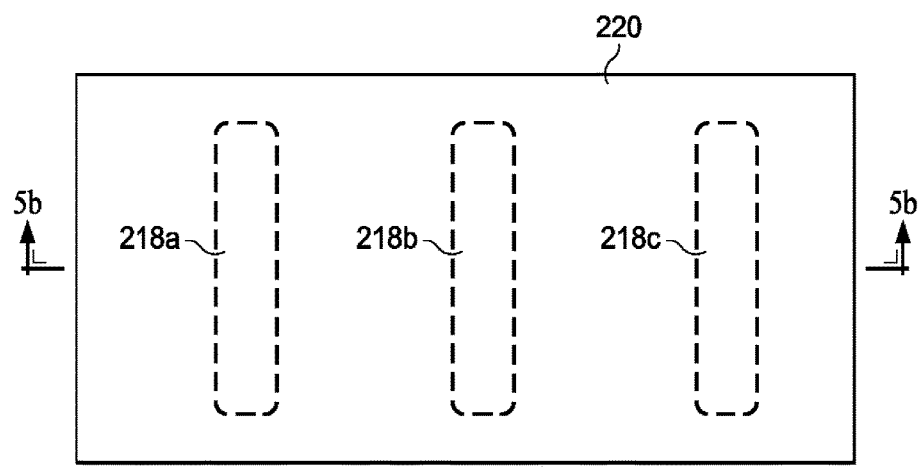
Figure 5B:
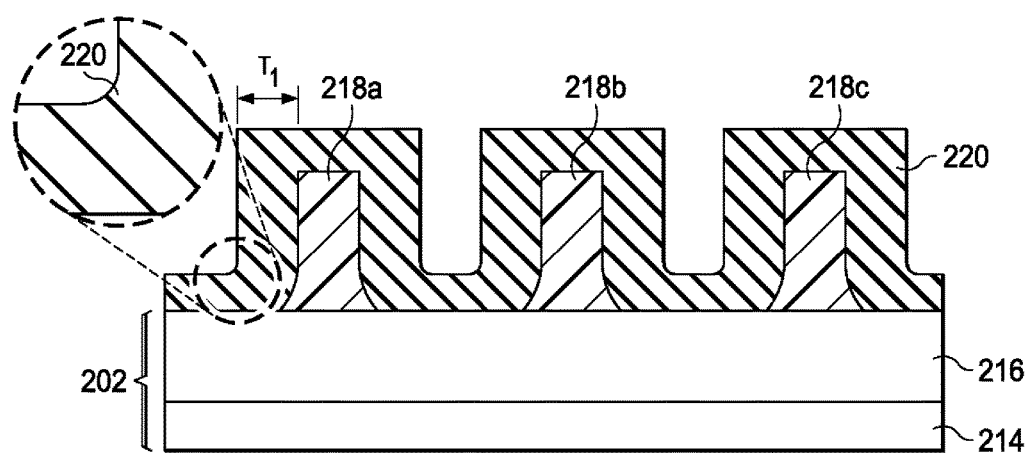

The method 100 (FIG. 1) proceeds to operation 106 by forming a spacer layer 220 over the substrate 202 and over and around the mandrel lines 218a-c. Referring to FIGS. 5a and 5b, the spacer layer 220 is formed over the substrate 202, more specifically, over the material layer 216. The spacer layer 220 is also formed over the mandrel lines 218a-c and onto the sidewalls of the mandrel lines 218a-c. The spacer layer 220 has a first thickness $T_1$. The spacer layer 220 includes one or more material or composition different from the material layer 216 and the mandrel lines 218a-c. In an embodiment, the spacer layer 220 may include a dielectric material, such as titanium nitride, silicon nitride, silicon oxide, or titanium oxide. The spacer layer 220 may be formed by a suitable process, such as a deposition process. For example, the deposition process includes a chemical vapor deposition (CVD) process or a physical vapor deposition (PVD) process. As illustrated in FIG. 5b, partly due to the footing issue aforementioned, the spacer material disposed over the material layer 216 forms blunt angles, rather than right angles, with the spacer material disposed onto the sidewalls of the features 218a-c. In some cases, the deposition of the spacer layer 220 may exacerbate the footing issue.

Figure 6A:
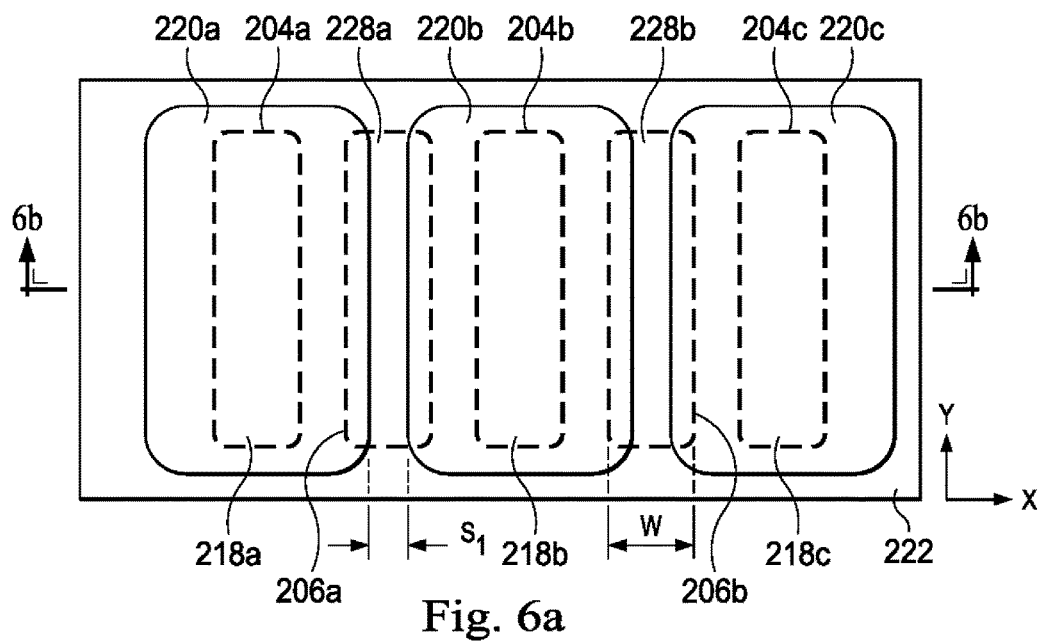
Figure 6B:
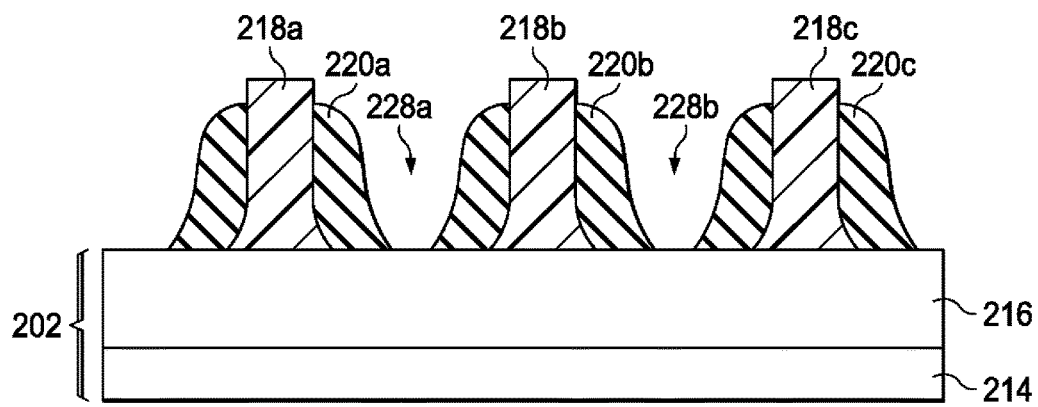

The method 100 (FIG. 1) proceeds to operation 108 by etching the spacer layer 220 to expose the mandrel lines 218a-c and the material layer 216. Referring to FIGS. 6a and 6b, the top surfaces of the mandrel lines 218a-c are exposed by this etching process and the spacer material disposed over the material layer 216 is also partially removed, providing spacer features 220a-c on the sidewalls of the mandrel lines 218a-c respectively. Two trenches 228a and 228b are formed between the spacer features 220a-c with a dimension $S_1$ in X direction. In an embodiment, the process of etching the spacer layer 220 includes an anisotropic etch such as a dry (or plasma) etch. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Also illustrated in FIG. 6a in dotted lines are the target features 204a-c and 206a-b of FIG. 2. The target features 204a-c, to be formed at where the features 218a-c reside, will have desired dimensions. However, the target features 206a-b, to be formed into the trenches 228a-b, will have a substantially smaller dimension ($S_1$) than the desired dimension W in X direction. This is partially due to the footing issue aforementioned (FIGS. 4b and 5b). Moreover, the dry etching process applied to the spacer layer 220 may have different etching rates at the top and bottom of the spacer features. In some instances, particularly with dense spacer features, the dry etching process may remove more spacer material at the top than at the bottom of the spacer features. This further exacerbates the footing issue, resulting in the dimension $S_1$ substantially smaller than the target dimension W.

The method 100 (FIG. 1) proceeds to operation 110 by shrinking the spacer features 220a-c in order to increase the dimension of the trenches 228a-b in X direction to match the dimension W. In the present embodiment, a wet cleaning process is applied to the spacer features 220a-c, which reduces the dimensions of the spacer features 220a-c without materially altering the mandrel lines 218a-c and the material layer 216.

Figure 7A:
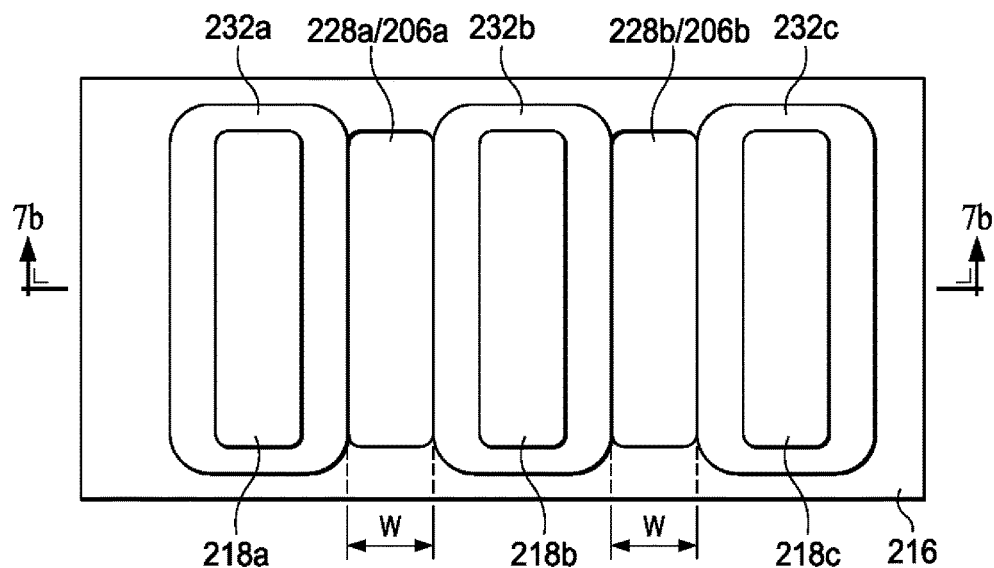
Figure 7B:
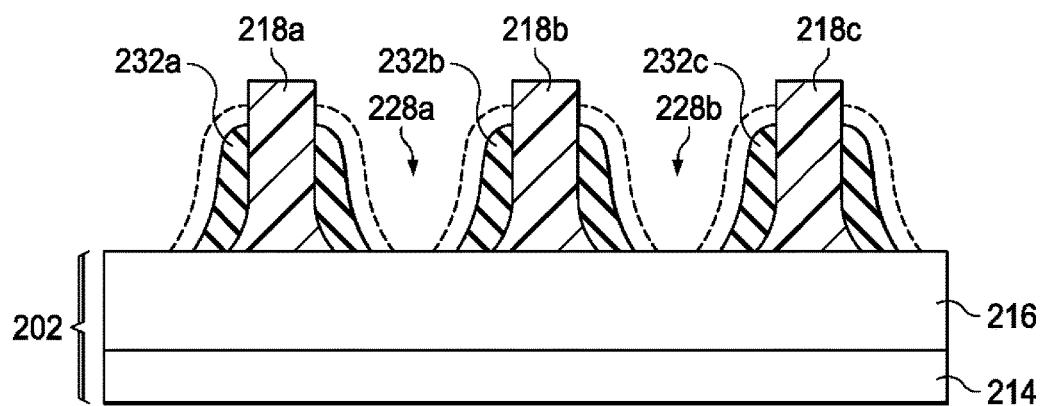

Referring to FIGS. 7a and 7b, for the sake of convenience, the reduced spacer features are denoted 232a-c while portions of the outer surfaces of the original spacer features 220a-c are shown in dotted lines for comparison (FIG. 7b). As a result of the wet cleaning process, the trenches 228a-b are expanded to substantially matching the target features 206a-b. In the present embodiment, the wet cleaning process applies a cleaning solution selectively tuned to partially remove the spacer material while the mandrel lines 218a-c and the material layer 216 remain substantially unaltered. In an embodiment where the spacer material uses titanium nitride or titanium oxide, the wet cleaning process applies either an acid solution with a pH in the range of 3 to 6, such as hydrofluoric acid (HF), or a basic solution with a pH in the range of 8 to 10, such as SC1 solution (e.g., a 1:1:5 mixture of ammonium hydroxide ($NH_4OH$), hydrogen peroxide ($H_2O_2$) and water ($H_2O$)). Either the HF or the SC1 solution provides an etching rate for the selected spacer material at about 10 to 30 angstroms per minute in a temperature below 60 degrees Celsius, such as a temperature between about 25 degrees Celsius and 60 degrees Celsius. A higher etching rate is achieved with a higher temperature, such as between about 60 degrees Celsius and 80 degrees Celsius. In another embodiment where the spacer material uses silicon nitride, the wet cleaning process applies an acid solution with a pH in the range of 3 to 6, such as HF or phosphoric acid ($H_2PO_4^-$), which provides an etching rate for the selected spacer material at about 10 to 20 angstroms per minute in a temperature below 60 degrees Celsius, such as a temperature between about 25 degrees Celsius and 60 degrees Celsius. A higher etching rate is achieved with a higher temperature, such as between about 60 degrees Celsius and 80 degrees Celsius. In addition to shrinking the spacer features 220a-c, the wet cleaning process provides additional benefits of removing from the material layer 216 any residue resulted from the spacer etching process.

Figure 8A:
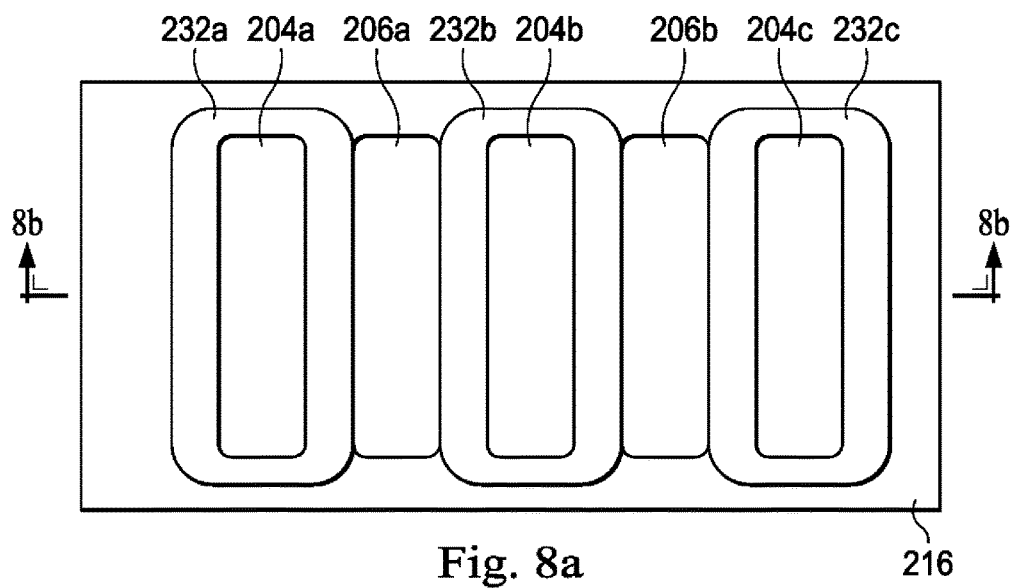
Figure 8B:
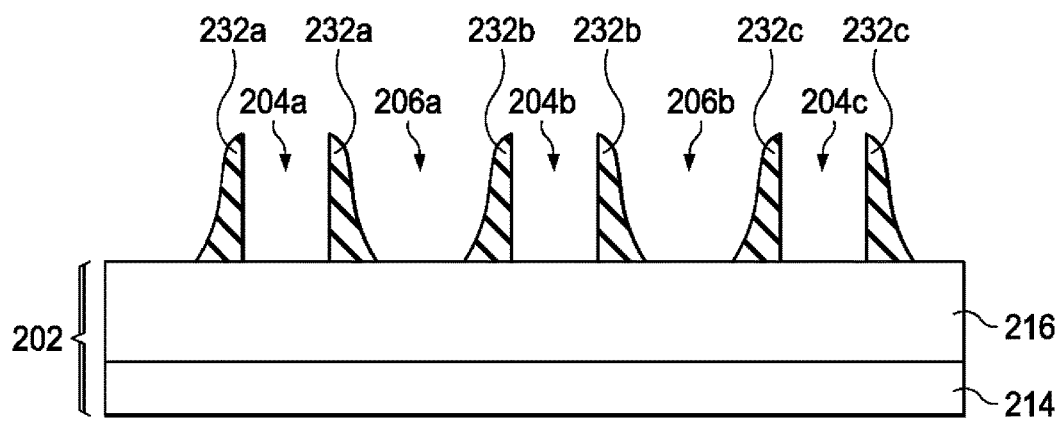
Figure 9A:
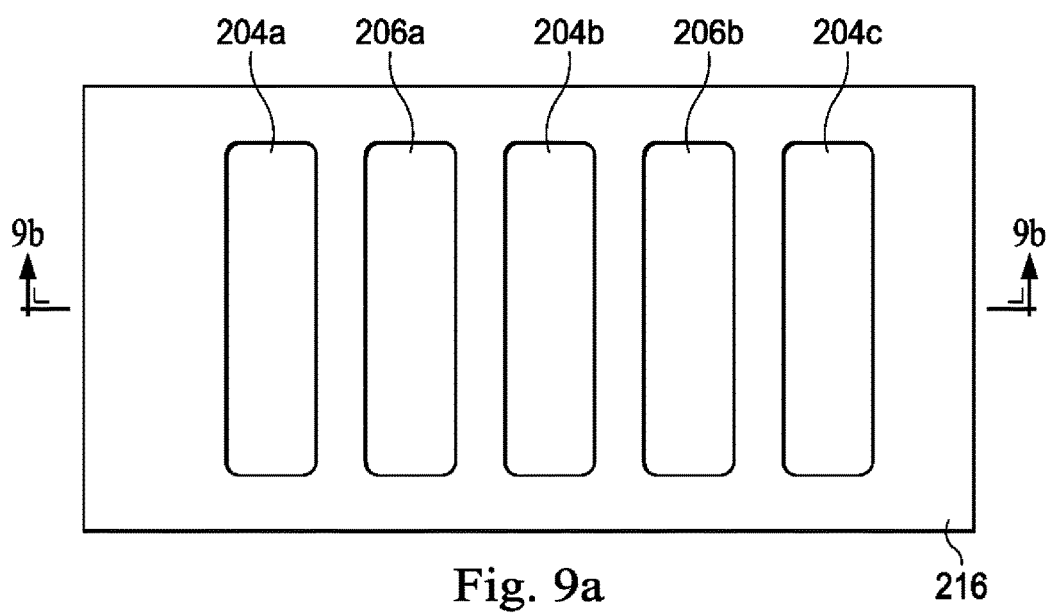
Figure 9B:
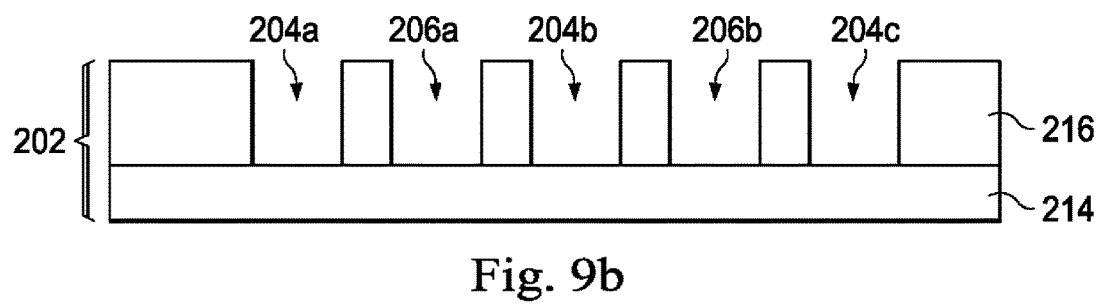

The method 100 (FIG. 1) proceeds to operation 112 by removing the mandrel lines 218a-c. Referring to FIGS. 8a and 8b, the mandrel lines 218a-c are removed. The spacer features 232a-c define five trenches, 204a-c and 206a-b, over the substrate 202. The mandrel lines 218a-c are removed using a process tuned to selectively remove the mandrel lines 218a-c while the spacer features 232a-c remain. In an embodiment, the mandrel lines 218a-c use a resist material and the process of removing the mandrel lines 218a-c uses wet stripping or plasma ashing.

The method 100 (FIG. 1) proceeds to operation 114 by transferring the pattern from the spacer features 232a-c to the material layer 216 using a suitable process such as an anistropic etching process. The spacer features 232a-c are thereafter removed, resulting in a pattern formed in the material layer 216 (FIGS. 9a and 9b), matching the target pattern 200 (FIG. 2).

The method 100 (FIG. 1) proceeds to operation 116 to form a final pattern or device with the patterned material layer 216. In an embodiment, a target pattern is to be formed as metal lines in a multilayer interconnection structure. For example, the metal lines may be formed in an inter-layer dielectric (ILD) layer. In such a case, the operation 116 forms a plurality of trenches in the ILD layer using the patterned material layer 216; fills the trenches with a conductive material, such as a metal; and polishes the conductive material using a process such as chemical mechanical polishing to expose the patterned ILD layer, thereby forming the metal lines in the ILD layer.

In another embodiment, the operation 116 forms fin field effect transistor (FinFET) structures on a semiconductor substrate using the patterned material layer 216. In this embodiment, the operation 116 forms a plurality of trenches in the semiconductor substrate. Shallow trench isolation (STI) features are further formed in the trenches by a procedure that includes deposition to fill the trenches with a dielectric material and polishing (such as CMP) to remove excessive dielectric material and to planarize the top surface of the semiconductor substrate. Thereafter, a selective etch process is applied to the dielectric material to recess the STI features, thereby forming fin-like active regions.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

In one exemplary aspect, the present disclosure is directed to a method of forming a target pattern for an integrated circuit (IC). The method includes forming a plurality of lines over a substrate with a first mask and forming a spacer layer over the substrate, over the plurality of lines, and onto sidewalls of the plurality of lines. The method further includes removing at least a portion of the spacer layer to expose the plurality of lines and the substrate. The method further includes shrinking the spacer layer disposed onto the sidewalls of the plurality of lines and removing the plurality of lines thereby providing a patterned spacer layer over the substrate.

In another exemplary aspect, the present disclosure is directed to a method of forming a target pattern for an integrated circuit (IC). The method includes patterning a substrate with a first mask thereby forming a first plurality of features and forming a spacer layer over the substrate and over sidewalls of the first plurality of features. The method further includes anisotropically etching at least a portion of the spacer layer to expose the first plurality of features and to expose the substrate. The method further includes cleaning the spacer layer with a chemical solution to reduce a thickness of the spacer layer in a controlled manner and removing the first plurality of features thereafter.

In yet another exemplary aspect, the present disclosure is directed to a method of forming a pattern on a substrate. The method includes forming two lines over the substrate using a photolithograph process, the two lines having a first dimension in a first direction. The method further includes depositing a first material over the substrate, over the two lines and onto sidewalls of the two lines. The method further includes performing an anisotropic etching process to the first material to expose the substrate and the two lines. The method further includes performing a wet cleaning process to reduce a thickness of the first material such that the first material disposed onto the sidewalls of the two lines are spaced away by a second dimension in the first direction, and thereafter removing the two lines.

What is claimed is:

1. A method of forming a target pattern for an integrated circuit, the method comprising:
   forming a plurality of lines over a substrate;
   forming spacer features on sidewalls of the lines;
   shrinking the spacer features using a wet process; and
   after the shrinking of the spacer features, removing the lines thereby providing the shrunk spacer features over the substrate.

2. The method of claim 1, wherein the forming of the spacer features includes:
   forming a spacer layer over the substrate, over the lines, and onto sidewalls of the lines; and etching the spacer layer to expose top surfaces of the lines and portions of the substrate, leaving portions of the spacer layer on the sidewalls of the lines as the spacer features.

3. The method of claim 1, further comprising:
etching the substrate using at least the shrunk spacer features as an etch mask; and
after the etching of the substrate, removing the shrunk spacer features.

4. The method of claim 1, wherein the lines include a resist material.

5. The method of claim 1, wherein the shrinking of the spacer features is isotropic and the wet process uses a solution selectively tuned to remove a portion of the spacer features while the lines and the substrate remain substantially unaltered.

6. The method of claim 1, wherein:
the spacer features include titanium, titanium oxide, or silicon nitride; and
the wet process uses hydrofluoric acid (HF).

7. The method of claim 1, wherein:
the spacer features include titanium nitride or titanium oxide; and
the wet process uses SC1 solution.

8. The method of claim 7, wherein the SC1 solution includes a 1:1:5 mixture of ammonium hydroxide ($NH_4OH$), hydrogen peroxide ($H_2O_2$), and water ($H_2O$).

9. The method of claim 8, wherein the shrinking the spacer features is performed at a temperature between about 25 and about 80 degrees Celsius.

10. The method of claim 1, wherein:
the spacer features include silicon nitride; and
the wet process uses phosphoric acid ($H_2PO_4^-$).

11. The method of claim 10, wherein the shrinking the spacer features is performed at a temperature between about 25 and about 80 degrees Celsius.

12. A method comprising:
forming two lines over a substrate;
depositing a first material over the substrate, over the two lines, and onto sidewalls of the two lines;
etching the first material to expose the substrate and the two lines, leaving first portions of the first material on the sidewalls of the two lines;
performing a wet cleaning process to the first portions to reduce a thickness of the first portions; and
after the performing of the wet cleaning process, removing the two lines.

13. The method of claim 12, wherein:
the two lines each have a first dimension in a first direction;
a space between the respective portions of the first material on the sidewalls of the two lines has a second dimension in the first direction after the performing of the wet cleaning process; and
the first and second dimensions are about the same.

14. The method of claim 12, wherein the two lines include a resist material.

15. The method of claim 12, wherein the wet cleaning process using a solution selectively tuned to remove a portion of the first material while the two lines and the substrate remain substantially unaltered, and wherein the reduction of the thickness of the first portions is isotropic.

16. The method of claim 12, wherein:
the first material uses a dielectric material containing metal; and
the wet cleaning process uses a chemical solution with a pH about 3 to 6 or with a pH about 8 to 10.

17. A method of forming a target pattern for an integrated circuit, the method comprising:
forming a plurality of features over a substrate;
depositing a spacer layer over the substrate and the features;
anisotropically etching at least a portion of the spacer layer to expose the features and the substrate;
cleaning the spacer layer with a chemical solution to reduce a thickness of the spacer layer while the features and the substrate remain substantially unaltered; and
after the cleaning of the spacer layer, removing the features.

18. The method of claim 17, wherein:
the spacer layer uses titanium nitride or titanium oxide; and
the chemical solution uses hydrofluoric acid (HF) or SC1 solution.

19. The method of claim 17, wherein:
the spacer layer uses silicon nitride; and
the chemical solution uses hydrofluoric acid (HF) or phosphoric acid ($H_2PO_4^-$).

20. The method of claim 17, wherein the reduction of the thickness of the spacer layer is isotropic.

* * * * *